United States Patent
Carrillo et al.

(10) Patent No.: US 9,223,921 B1
(45) Date of Patent: Dec. 29, 2015

(54) COMPILATION OF HLL CODE WITH HARDWARE ACCELERATED FUNCTIONS

(71) Applicant: Xilinx, Inc., San Jose, CA (US)

(72) Inventors: Jorge E. Carrillo, San Jose, CA (US); L. James Hwang, Portola Valley, CA (US); Hua Sun, San Jose, CA (US); Sundararajarao Mohan, Sunnyvale, CA (US); Vinod K. Kathail, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/540,854

(22) Filed: Nov. 13, 2014

(51) Int. Cl.
*G06F 17/50* (2006.01)

(52) U.S. Cl.
CPC .................. *G06F 17/5045* (2013.01)

(58) Field of Classification Search
CPC .................. G06F 8/41; G06F 8/40
USPC .......................................... 716/102
See application file for complete search history.

(56) References Cited

U.S. PATENT DOCUMENTS

| | | | |
|---|---|---|---|
| 6,701,501 B2 * | 3/2004 | Waters et al. ............ | 716/103 |
| 6,996,799 B1 * | 2/2006 | Cismas et al. ............ | 717/106 |
| 7,308,672 B2 * | 12/2007 | Waters et al. ............ | 716/103 |
| 7,376,939 B1 * | 5/2008 | Nayak et al. ............. | 717/144 |
| 7,493,472 B2 * | 2/2009 | Baxter ..................... | 712/43 |
| 8,141,048 B2 * | 3/2012 | Baumgartner et al. .... | 717/126 |
| 8,205,175 B2 * | 6/2012 | Waters et al. ............ | 716/101 |
| 8,762,916 B1 | 6/2014 | Kathail et al. | |
| 8,775,986 B1 | 7/2014 | Mohan et al. | |
| 2004/0143801 A1 * | 7/2004 | Waters et al. ............ | 716/3 |
| 2005/0097523 A1 * | 5/2005 | Uchida ..................... | 717/136 |
| 2005/0268070 A1 * | 12/2005 | Baxter ..................... | 711/203 |
| 2006/0259871 A1 * | 11/2006 | Washington et al. .... | 715/763 |
| 2008/0141227 A1 * | 6/2008 | Waters et al. ............ | 717/140 |
| 2008/0209389 A1 * | 8/2008 | Baumgartner et al. .... | 717/104 |
| 2011/0231644 A1 * | 9/2011 | Ishebabi .................. | 713/100 |
| 2012/0096445 A1 * | 4/2012 | Berg et al. ............... | 717/140 |

OTHER PUBLICATIONS

U.S. Appl. No. 13/925,501, Carrillo, Jorge E., et al., Xilinx, Inc. San Jose, CA, USA.

* cited by examiner

*Primary Examiner* — Suchin Parihar
(74) *Attorney, Agent, or Firm* — Jonathan B. Soike; LeRoy D. Maunu

(57) ABSTRACT

In an example implementation, a method is provided for compiling an HLL source file. The HLL source file checked for function calls to a set of hardware-accelerated functions having hardware implementations specified in a hardware library. For each HLL function call to a hardware-accelerated function, a circuit design is retrieved from the hardware library. The circuit design specifies a hardware implementation of the hardware-accelerated function. HLL interface code configured to communicate with the hardware implementation of the hardware-accelerated function is also generated. The HLL function call to the hardware-accelerated function in the HLL source file is replaced with the generated interface code. The HLL source file is compiled to generate a program executable on a processor of a programmable IC. Configuration data is generated that implements the retrieved circuit designs on the programmable circuitry of the programmable IC.

20 Claims, 5 Drawing Sheets

COMPILATION OF HLL CODE WITH HARDWARE ACCELERATED FUNCTIONS

FIELD OF THE INVENTION

The disclosure generally relates to development of system designs using high-level languages (HLLs).

BACKGROUND

Programmable integrated circuits (ICs) may be programmed by a user to perform specified logic functions. One type of programmable IC, known as a field programmable gate array (FPGA), typically includes programmable resources that are arranged in an array of programmable tiles including, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Programmable ICs provide flexible hardware solutions that are advantageous for high performance parallel computing in advanced digital communications and video applications. For many complex applications, it may be desirable to implement a portion of the design in software (a program design) and a portion of the design in programmable resources. Many manufacturers, such as Xilinx, Inc., include embedded processor systems in a number of programmable ICs. These embedded processor systems can meet both software and hardware programmable needs. Embedded processor systems often include operating memory, software instruction storage, input/output, and other components of a computer system. These systems are referred to as system on chip (SOC) solutions. In these systems, designers may implement complex functions in programmable logic to increase efficiency and throughput. This architectural combination gives an advantageous mix of serial and parallel processing, flexibility, and scalability, thereby enabling a more optimized system partitioning.

Current SOC digital hardware design is done using hardware description languages (HDLs) such as Verilog and VHDL. These languages provide special constructs to handle the description of digital hardware-specific entities such as registers and clocks. While these languages are effective in describing hardware circuits, they provide little in the way of high-level abstractions to manage the complexity of modern designs. In contrast, modern software languages, and in particular object-oriented high-level languages (HLL) such as Java and C++ provide robust high-level constructs that are very effective at managing complexity and serve to improve designer productivity as well as design quality. Synthesizing compilers have been created to infer and perform hardware synthesis to generate hardware circuits configured to implement an HLL-specified design. The ability to describe circuits using an HLL allows a designer to focus on the algorithms, rather than the implementation details.

SUMMARY

In one implementation, a method is provided for compiling an HLL program. A command is input that indicates an HLL source file to be compiled. The HLL source file is checked for function calls to a set of functions having hardware implementations specified in a hardware library. For each HLL function call to one of the set of functions in the hardware library, a circuit design is retrieved from the hardware library. The circuit design specifies the hardware implementation of the function corresponding to the encountered function call. HLL interface code configured to communicate with the hardware implementation of the function is also generated. The HLL function call in the HLL source file to the function is replaced with the generated HLL interface code. After traversing the HLL source file, the HLL source file is compiled to generate a program executable on a processor of a programmable IC. A set of configuration data is generated that implements the circuit designs retrieved from the hardware library on the programmable circuitry of the programmable IC.

In another implementation, a method is provided for generating an HLL library that specifies hardware implementations of a set of functions. For each of the set of functions, a respective circuit design is provided that specifies a hardware implementation of the function. An HLL interface code template for communicating with the circuit design is generated. The circuit design and the HLL interface code template are stored, and associated with each other, in a data structure defining the HLL library.

Other features will be recognized from consideration of the Detailed Description and Claims, which follow.

BRIEF DESCRIPTION OF THE DRAWINGS

Various aspects and features will become apparent upon review of the following detailed description and upon reference to the drawings in which.

DETAILED DESCRIPTION OF THE DRAWINGS

Figure 1:
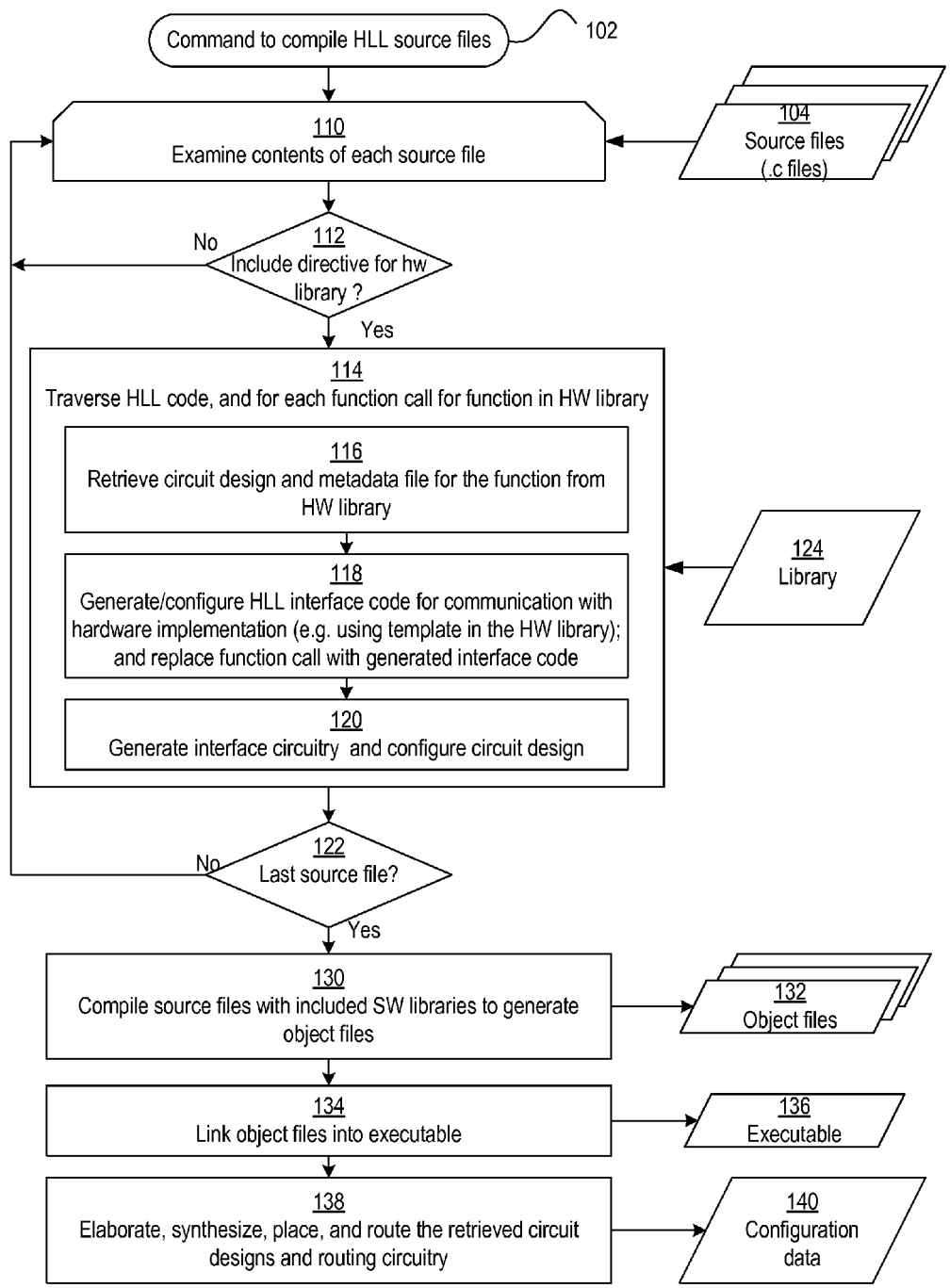
FIG. 1 shows a process for compiling HLL code including a call to a hardware-accelerated function specified in an HLL library.

Methods and systems are disclosed for compiling programs written in HLL programming languages that are to be implemented in devices that integrate processors with programmable logic resources, such as XILINX Zynq™ SOCs, without a need to write any hardware description language code or any interface between them. More specifically, the disclosed methods and systems support compilation of an HLL program having function calls to a set of functions defined in a library that are to be implemented in hardware, such as on programmable circuitry of a programmable IC. For ease of reference, functions to be implemented on programmable circuitry of a programmable IC may be referred to as hardware-accelerated functions.

Various implementations allow a user to invoke a hardware accelerated function via an HLL function call in an HLL source file. The user may use HLL function calls to the hardware accelerated function in the same manner as the user would call an HLL function in an HLL library. When the source file is compiled, the compiler automatically retrieves files and information from the library to implement the hardware accelerated function in hardware and to generate interface code and circuits to communicate data between the hardware accelerated function and the HLL program.

Some implementations provide a method for compiling an HLL program that includes function calls to one or more hardware-accelerated functions. A command is input that indicates an HLL source file to be compiled. In response to the source file having an include declaration for a hardware library that specifies a set of hardware accelerated functions, a compiler determines whether or not the HLL source file has any calls to the hardware-accelerated functions while traversing the source file. For each HLL function call to one of the hardware-accelerated functions, a respective circuit design is retrieved by the compiler from the hardware library. The circuit design specifies a hardware implementation of the hardware-accelerated function indicated by the function call. HLL interface code, which is configured to communicate with the hardware implementation, is generated by the compiler. The compiler replaces the HLL function call in the HLL source file with the generated HLL interface code. The compiler may also retrieve or generate interface circuitry for bridging and routing data between arguments of the HLL interface code and ports of the respective circuit design. After traversing the HLL source file and replacing function calls to hardware accelerated function, the HLL source file is compiled to generate a program executable on a processor of the programmable IC. A set of configuration data is also generated. The set of configuration data implements the retrieved circuit designs and the interface circuitry on the programmable circuitry of the programmable IC.

For ease of reference, a library defining hardware-accelerated functions may be referred to as a hardware library. Also for ease of reference, circuits that implement a hardware-accelerated function in hardware may be referred to as a hardware implementation of the function.

Turning now to the figures, FIG. 1 shows a process for compiling an HLL program in accordance with one or more implementations. The process is initiated by a command 102 indicating one or more HLL source files to be compiled. In response to a command 102 (e.g., terminal command or executable script command), each source file 104 indicated by the command is examined at block 110. For each source file, if the source file includes an include directive indicating a library 124 of hardware accelerated functions, decision block 112 directs the process to block 114 where HLL code of the source file is traversed. For each function call to a hardware accelerated function included in the library 124, a circuit design and metadata file (e.g., an XML file) for the hardware accelerated function is retrieved from the library 124 at block 116.

The circuit design specifies a hardware implementation for the hardware accelerated function. The hardware implementation may be specified as HDL code or as logical network list (netlist) for one or more target platforms. In some implementations, the circuit design may be specified by HLL code that describes functionality to be implemented in hardware. If the circuit design is specified as HLL code, the process may use an HLL synthesis tool to generate a netlist for a hardware implementation of the logic specified by HLL code. An example process for synthesis of a netlist from HLL code is described in more detail with reference to FIG. 4. The metadata file retrieved at block 116 indicates a mapping of arguments of the HLL function call to ports of the hardware implementation of the function. In some implementations, the metadata file may also describe default configuration settings for the circuit design.

At block 118, HLL interface code is generated for communication with the hardware implementation of the function. The generated HLL interface code communicates data between memory locations corresponding to arguments of the function call and ports of the hardware implementation of the function. The HLL interface code also synchronizes processes performed by the HLL source file and the hardware implementation of the function. In some implementations, the HLL interface code may be generated by supplementing or configuring an interface code template associated with the hardware-accelerated function in the library 124. An example process for generation of HLL interface code is described with reference to FIG. 3. Also at block 118, the encountered function call to the hardware-accelerated function is replaced with the generated interface code in the source file.

At block 120, the circuit design is configured according to settings in the retrieved metadata file. Interface circuitry is also generated at block 120 for bridging and routing signals between arguments of the HLL interface code and corresponding ports of the hardware implementation mapped to the arguments in the metadata file. In different implementations, the generated interface circuitry may communicate data using various communication protocols and/or communication circuits. For example, the interface circuit may provide hardware buffered connections for communicating data between the memory locations for the HLL arguments and ports of the hardware implementation of the function. As another example, the interface circuitry may include duplication circuits configured to route a single argument to multiple destinations. For instance, a duplication circuit may route data from a memory location for a first argument to a combination of other memory locations and/or ports of the hardware implementation of the function. In some implementations, the routing circuitry may include a direct memory access DMA communication circuit configured to perform read or write data transactions initiated by either the HLL code running on a processor or by the hardware implementation of the function.

The processes performed at blocks 110, 112, 114, 116, 118, and 120, are repeated for each source file 104 until the last source file has been processed, as indicated by decision step 122. After which, the source files are compiled at block 130 to generate object files 132. At block 134, the object files 132 are linked into an executable 136. The circuit designs retrieved from the library 124 and generated interface circuits are elaborated, synthesized, placed and routed at block 138 (if required) to produce a set of configuration data 140. During elaboration, HLL or HDL code for a circuit is expanded to produce a fully-expanded parse tree of all module instances invoked by the code. During synthesis, a netlist is created that specifies resources of a programmable IC to implement all of the module instances in elaborated design. The configuration data is configured to program programmable resources of a target programmable IC to implement the circuit designs and interface circuits.

Figure 2:
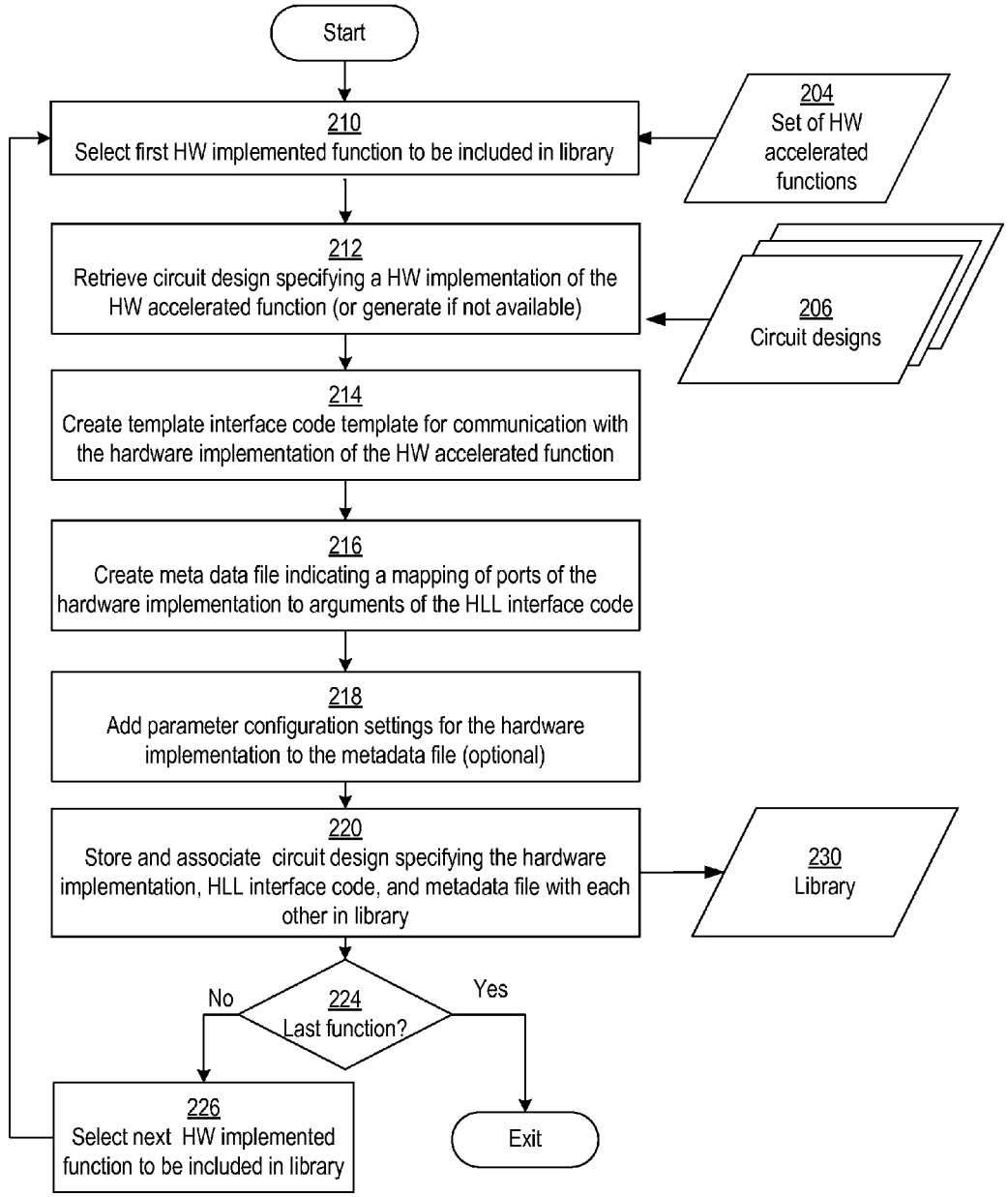
FIG. 2 shows a process for generating an HLL library for a set of hardware-accelerated functions.

FIG. 2 shows a process for generating a HLL library for a set of hardware-accelerated functions 204. A first one of the hardware-accelerated functions 204 to be included in the library is selected at block 210. A circuit design 206 specifying a hardware implementation for the function is retrieved at block 212. In some implementations, the circuit design may be generated at block 212, for example from HLL code describing logic of the function. An HLL interface code template is generated at block 214 for communication with the hardware implementation of the function. The interface code template includes a function having the same arguments as an HLL function call to the hardware-accelerated function. In some implementations, the body of interface code template includes code to facilitate communication data between the arguments and a respective port of the hardware implementation of the function. The communication code may include various parameters that may be reconfigured at compile time. For instance, parameters may be adjusted to accommodate various data lane width and/or protocols used to bridge and route signals to the hardware implementation of the function. In some other implementations, the body of the interface code template may be generated and added at compile time. Code that may be included in or added to the body of the interface code template is discussed in more detail with reference to FIG. 3.

A metadata file is created at block 216. The metadata file includes a mapping of ports of the hardware implementation to arguments of the HLL interface code. Optionally, parameter information indicating configuration settings for the hardware implementation may be added to the metadata file at block 218. At block 220, the circuit design specifying the hardware implementation for the function, the HLL interface code template, and the metadata file are stored in and associated with each other in library 230.

If there are remaining hardware-accelerated functions 204 to be added to the hardware library, at decision block 224, the next hardware-accelerated function is selected at block 226 and the processes performed at blocks 210, 212, 214, 216, 218, and 220, are repeated. If the selected function is the last of the hardware-accelerated functions at decision block 224, the process exits.

As discussed with reference to FIGS. 1 and 2 in various implementations a library of hardware-accelerated functions may include a respective metadata file for each function, which includes information mapping connections between HLL arguments of the function and ports of a hardware implementation of the function. The information may indicate, for example, a name of the hardware-accelerated function; a name or reference pointer for the HLL argument; a direction of data flow (e.g., to the argument or to the port); a bus interface reference name of a port, interface type of the port; a data width of the connection; a number of elements in an array argument; a latency estimation for the hardware implementation, and/or an estimation of resources required for the connection. Example 1 shows an example entry in a metadata file that specifies a mapping of connections between HLL arguments X and Y to ports S_AXIS_DATA and M_AXIS_DATA.

```
<xd:fcnMap                    xd:fcnName="fir"
xd:componentRef="fir_compiler">
  <xd:ctrlReg xd:type="none"/>
  <xd:arg xd:name="X"
  xd:direction="in"
  xd:portInterfaceType="axis"
  xd:dataWidth="8"
  xd:busInterfaceRef="SAXISDATA"
  xd:arraySize="32"/>
  <xd:arg xd:name="Y"
  xd:direction="out"
  xd:portInterfaceType="axis"
  xd:dataWidth="16"
  xd:busInterfaceRef="MAXISDATA"
  xd:arraySize="32"/>
  <xd:latencyEstimates xd:worst-case="17"
  xd:average-case="17"
  xd:best-case="17"/>
  <xd:resourceEstimates    xd:BRAM="0"    xd:DSP="1"
xd:FF="200" xd:LUT="200"/>
</xd:accMap>
```

Example 1

As previously indicated, in some implementations, the metadata file may also include data indicating configuration settings for one or more parameters of the hardware implementation of the function. For example, the metadata file may include a number of entries, each indicating a respective parameter name and a setting for the parameter. Example 2 shows an example entry in a metadata file that specifies settings for 7 parameters DATA_Has_TLAST, M_DATA_Has_TREADY, Coefficient_Width, Data_Width, Quantization, Output_Rounding_Mode, and Coefficient_Reload. The implementations are not limited to the data or formats shown in Examples 1 and 2. Rather, in various implementations, the metadata file may include other information and/or may store data in other formats.

```
<?xml version="1.0" encoding="UTF-8"?>
<xd:component    xmlns:xd="http://www.xilinx.com/xi-
dane"
  xd:name="fircompiler">
  <xd:parameter          xd:name="DATA_Has_TLAST"
xd:value="Packet_Framing"/>
  <xd:parameter     xd:name="M_DATAHas_TREADY"
xd:value="true"/>
  <xd:parameter              xd:name="Coefficient_Width"
xd:value="8"/>
  <xd:parameter xd:name="Data_Width" xd:value="8"/>
  <xd:parameter                 xd:name="Quantization"
xd:value="Integer_Coefficients"/>
  <xd:parameter     xd:name="Output_Rounding_Mode"
xd:value="Full_Precision"/>
  <xd:parameter              xd:name="Coefficient_Reload"
xd:value="true"/>
</xd:component>
```

Example 2

Figure 3:
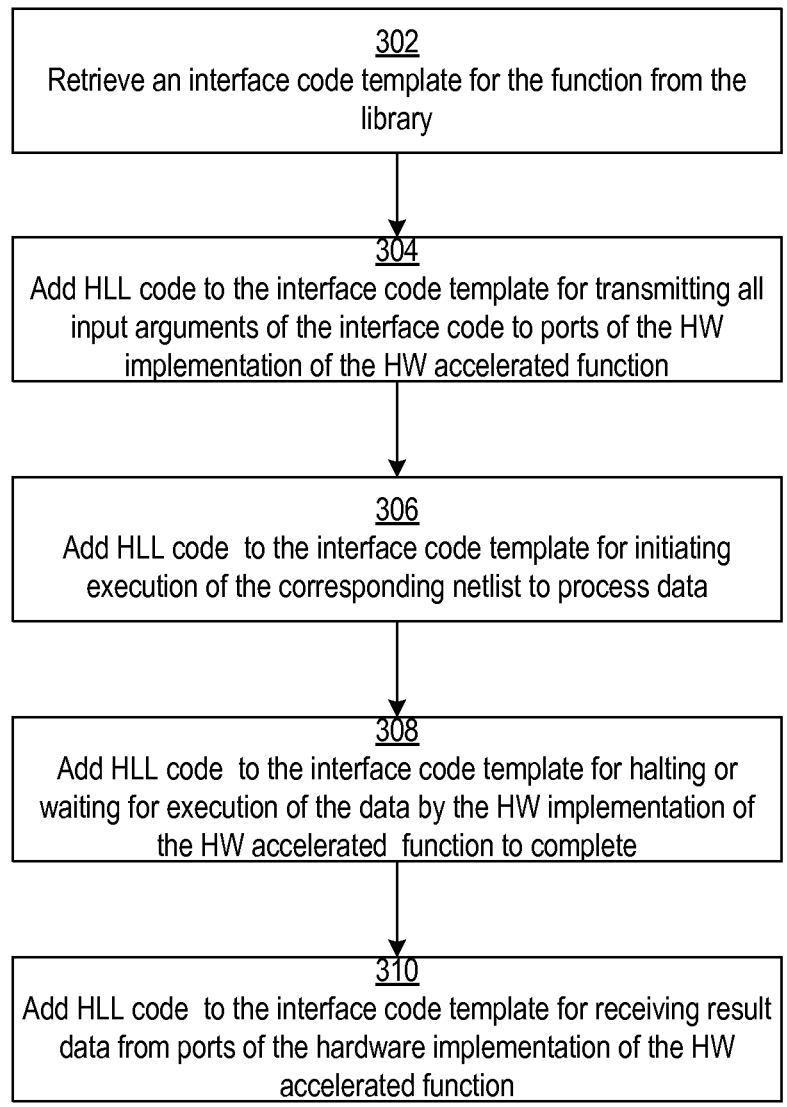
FIG. 3 shows a process for generation of HLL code for communication with a function to be implemented in hardware.

FIG. 3 shows a process for generation of HLL interface code for communication with a function to be implemented in hardware. At block 302, an interface code template for the hardware-accelerated function is retrieved from the library. The interface code template includes the same arguments of the HLL function call to the hardware-accelerated function. At block 304, HLL code is added to the body of the template. The added code directs transmission of arguments of the interface code to corresponding ports of the hardware implementation of the function.

At block 306, HLL code is added to the interface code template to initiate execution of the hardware implementation to process data. HLL code is added to the body of the interface code template at block 308 to cause the HLL function to halt or wait for processing of the data by the hardware implementation of the function to complete. At block 310, HLL code is added to the interface code template to receive result data from ports of the hardware implementation of the function. In some implementations, the code generated at blocks 304 and 310 calls additional lower level interface code for communication with the netlist that is generated later at link time (once data sizes are resolved).

For additional information regarding generation of interface code and interface circuits and/or synthesis of HDL circuits from HLL code, reference may be made to U.S. Pat. No. 8,762,916, titled AUTOMATIC GENERATION OF A DATA TRANSFER NETWORK; U.S. Pat. No. 8,775,986, titled SOFTWARE DEBUGGING OF SYNTHESIZED HARDWARE; and U.S. application Ser. No. 13/925,501, titled METHOD FOR COMPILING PROGRAMS FOR PROCESSORS WITH PROGRAMMABLE LOGIC, filed Jun. 24, 2013, which are fully incorporated by reference herein.

Figure 4:
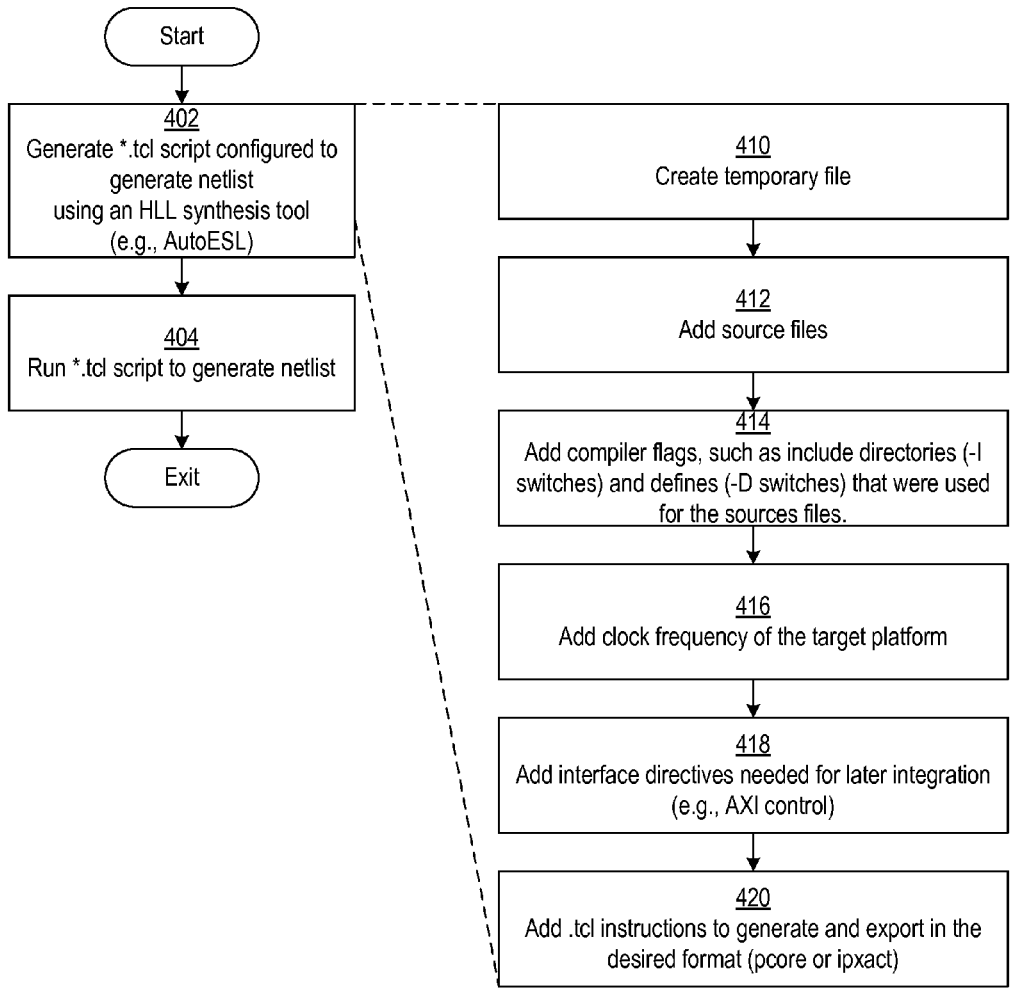
FIG. 4 shows a process for generation of a circuit specification from HLL code of a function.

FIG. 4 shows a process for generation of a netlist from HLL code of a function. At block 402, an executable script (e.g., Tool Command Language, TCL, script) is generated, and the script is configured to generate a netlist using an HLL synthesis tool (e.g., the Vivado HLS synthesis tool). The script is then executed at block 404 to generate a netlist.

The executable script is generated at block 402 by the processes performed at blocks 410, 412, 414, 416, 418, and 420. A temporary file is created to store the executable script at block 410. Pointers to the source files (e.g., 104) are added to the temporary file at block 412. Compiler flags, such as include directories, included in the command (e.g., 102) or a make file are added to the temporary file at block 414. A selected clock frequency of the target platform is added to the file at block 416. Interface directives needed for later integration (e.g., AXI control) are added to the file at block 418. At block 420, executable script instructions are added to the temporary file that are configured to cause the netlist to be generated (e.g., using a netlist synthesis tool) and exported in the desired format (pcore or ipxact). The temporary file may be deleted after netlists (e.g., 118) are generated (e.g., at block 116).

Figure 5:
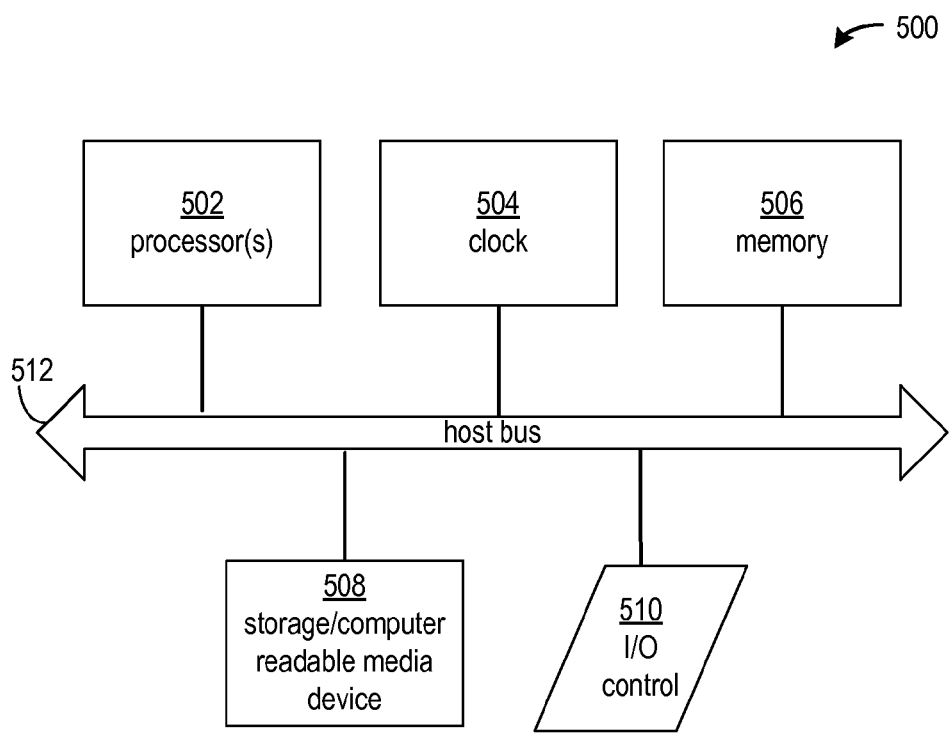
FIG. 5 shows a computing arrangement that may be used to perform one or more of the processes disclosed herein.

FIG. 5 shows a computing arrangement that may be used to perform one or more of the processes disclosed herein. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 500 includes one or more processors 502, a clock signal generator 504, a memory arrangement 506, a storage arrangement 508, and an input/output control unit 510, all coupled to a host bus 512. The arrangement 500 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 502 may be one or more general-purpose processors, or a combination of one or more general-purpose processors and suitable co-processors, or one or more specialized processors (e.g., RISC, CISC, pipelined.).

The memory arrangement 506 typically includes multiple levels of cache memory, and a main memory. The storage arrangement 508 may include local and/or remote persistent storage, such as provided by magnetic disks (not shown), flash, EPROM, or other non-volatile data storage. The storage unit may be read or read/write capable. Further, the memory arrangement 506 and storage arrangement 508 may be combined in a single arrangement.

The processor(s) 502 executes the software in storage arrangement 508 and/or memory arrangement 506, reads data from and stores data to the storage arrangement 508 and/or memory arrangement 506, and communicates with external devices through the input/output control arrangement 510. These functions are synchronized by the clock signal generator 504. The resource of the computing arrangement may be managed by either an operating system (not shown), or a hardware control unit (not shown).

Those skilled in the art will appreciate that various alternative computing arrangements, including one or more processors and a memory arrangement configured with program code, would be suitable for hosting the processes and data structures of the different disclosed implementations.

The disclosed method and system are thought to be applicable to a variety of systems for software development and compilation. Other aspects and features will be apparent to those skilled in the art from consideration of the specification. For instance, although implementations may in some cases be described in individual figures, it will be appreciated that features from one figure can be combined with features of another figure even though the combination is not explicitly shown or explicitly described as a combination. The method and system may be implemented with one or more processors configured to execute software, as an application specific integrated circuit (ASIC), or as a logic on a programmable logic device. It is intended that the specification and illustrated implementations be considered as examples only, with a true scope of the invention being indicated by the following claims.

What is claimed is:

1. A method for compiling a high-level language (HLL) program, comprising:
    performing on a programmed processor operations including:
        inputting a command that indicates an HLL source file to be compiled;
        checking the HLL source file for HLL function calls to a set of functions having hardware implementations specified in a hardware library, and for each HLL function call to a function of the set of functions:
            retrieving from the hardware library, a circuit design specifying the hardware implementation of the function corresponding to the function call;
            generating HLL interface code configured to communicate with the hardware implementation of the function according to a mapping of ports of the circuit design to arguments of the function call, wherein the mapping is specified in a metadata file included in the hardware library, and the HLL interface code is configured to route data between memory locations corresponding to the arguments of the function call and respective ports of the circuit design; and
            replacing the HLL function call in the HLL source file with the generated HLL interface code;
        compiling the HLL source file to generate a program executable on a processor of a programmable IC; and
        generating a set of configuration data that implements the circuit designs retrieved from the hardware library on programmable circuitry of the programmable IC.

2. The method of claim 1, wherein:
    the HLL interface code is further configured to synchronize processes performed by the HLL source file with processes performed by the hardware implementation of the function; and
    the checking of the HLL source file for HLL function calls to the set of functions is performed in response to the HLL source file having an include declaration for the hardware library; and the generating of the HLL interface code includes:
retrieving an interface code template for the function from the hardware library; and
supplementing the interface code template with code configured and arranged to communicate input arguments of the HLL function call to ports of the hardware implementation of the function.

3. The method of claim 2, wherein the generating of the HLL interface code further includes:
supplementing the interface code template with code that triggers execution of the hardware implementation of the function;
supplementing the interface code template with code that causes execution of the HLL program to halt; and
supplementing the interface code template with code configured to receive result data from the hardware implementation of the function.

4. The method of claim 1, further comprising, for each HLL function call to a function of the set of functions:
retrieving from the hardware library a metadata file indicating a mapping of ports of the hardware implementations of the functions to arguments of the generated HLL interface code for communication with the hardware implementation of the function.

5. The method of claim 4, wherein the metadata file includes configuration data specifying one or more configuration settings for one or more adjustable parameters of the hardware implementation of the function.

6. The method of claim 1, wherein the circuit design for the hardware implementation of at least one of the set of functions is specified as a netlist.

7. The method of claim 6, wherein:
the circuit design for the hardware implementation of the function of at least one of the set of functions is specified in an HDL or an HLL; and
the generating of the set of configuration data includes elaborating and synthesizing the circuit designs retrieved from the hardware library that are specified in an HDL or HLL.

8. The method of claim 1, further comprising generating a specification of interface circuitry configured to bridge and route signals between ports of the hardware implementations of the functions and memory locations corresponding to arguments of the HLL interface code for communication with the hardware implementations of the functions.

9. The method of claim 8, wherein the interface circuitry includes direct memory access (DMA) hardware and associated software drivers.

10. The method of claim 8, wherein the interface circuitry includes a buffered connection between a port of the hardware implementation of one of the functions and a memory location corresponding to an argument of the HLL interface code for communication with the hardware implementation of the function.

11. The method of claim 8, wherein the interface circuitry includes duplication circuits to route a single argument to multiple destinations including at least one memory location corresponding to an HLL argument and at least one port of the hardware implementation of one of the functions.

12. A method for generating a high-level language (HLL) library that specifies hardware implementations of a set of functions on programmable circuitry of a programmable IC, comprising:
using a processing circuit, for each of the set of functions:
providing a respective circuit design that specifies a hardware implementation of the function;
generating an HLL interface code template for communication with the hardware implementation; and
storing and associating the circuit design and the HLL interface code template with each other in a data structure defining the HLL library.

13. The method of claim 12, further comprising:
storing and associating a metadata file with the circuit design and the HLL interface code in the data structure defining the HLL library.

14. The method of claim 13, wherein the metadata file indicates a mapping of ports of the circuit design to arguments of the HLL interface code template for communication with the circuit design.

15. The method of claim 13, wherein the metadata file indicates configuration settings for at least one of the circuit designs.

16. The method of claim 12, wherein the generating of the HLL interface code template includes generating code to route data between memory locations corresponding to a set of arguments for the function and a set of ports of the respective circuit design to be mapped to the set of arguments during compilation.

17. The method of claim 12, wherein the respective circuit design for at least one of the set of functions is specified by HLL code.

18. The method of claim 17, wherein the storing of the respective circuit design includes generating of a respective netlist for the circuit design from the HLL code.

19. The method of claim 18, wherein the generating of the respective netlist for the circuit design from the HLL code includes generating an executable script configured and arranged to generate the netlist using an HLL synthesis tool.

20. The method of claim 19, wherein the generating of the respective netlist from the HLL code included in the function, includes:
executing the executable script to cause the HLL synthesis tool to convert each function call in the HLL code included in the function into a register-transfer-level circuit.

* * * * *